(12) United States Patent
Wang et al.

(10) Patent No.: US 6,527,968 B1
(45) Date of Patent: *Mar. 4, 2003

(54) TWO-STAGE SELF-CLEANING SILICON ETCH PROCESS

(75) Inventors: Xikun Wang, Sunnyvale, CA (US); Scott Williams, Sunnyvale, CA (US); Shaoher X. Pan, San Jose, CA (US)

(73) Assignee: Applied Materials Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/536,057

(22) Filed: Mar. 27, 2000

(51) Int. Cl.[7] .................................. B44C 1/22

(52) U.S. Cl. .............. 216/67; 216/68; 216/58; 216/63; 216/69; 216/70; 216/79; 438/706; 438/707; 438/710; 438/711; 438/714; 438/716; 438/719; 438/724; 438/726; 438/727; 438/734; 438/766; 438/905; 438/906; 134/1.1; 134/1.2; 134/1.3; 134/22.1; 134/22.18; 134/26; 134/30; 134/902

(58) Field of Search .................. 216/58, 63, 67, 216/68, 69, 70, 79; 438/706, 707, 710, 711, 714, 716, 719, 724, 726, 727, 734, 744, 905; 134/1.1, 1.2, 1.3, 2, 22.1, 22.14, 22.18, 22.19, 30, 34, 902; 156/345

(56) References Cited

U.S. PATENT DOCUMENTS

| | | | |
|---|---|---|---|
| 4,282,267 A | 8/1981 | Küyel | 427/38 |
| 4,433,228 A | 2/1984 | Nishimatsu et al. | 219/10.55 R |
| 4,465,532 A | 8/1984 | Fukano | 156/643 |
| 4,490,209 A | 12/1984 | Hartman | 156/643 |
| 4,502,914 A | 3/1985 | Trumpp et al. | 156/643 |

(List continued on next page.)

FOREIGN PATENT DOCUMENTS

| | | |
|---|---|---|
| DE | 4132559 | 4/1993 |
| EP | 0272143 | 6/1988 |
| EP | 0314990 | 5/1989 |
| EP | 0463373 | 1/1992 |
| EP | 0516043 | 12/1992 |
| EP | 0555546 | 8/1993 |
| EP | 0697467 | 2/1996 |
| EP | 0746015 | 12/1996 |
| JP | 6177092 | 6/1994 |
| JP | 7029879 | 1/1995 |
| JP | 10233387 | 9/1998 |
| WO | 9615545 | 5/1996 |

OTHER PUBLICATIONS

PCT Communication dated Nov. 8, 2000.

Aydil, et al., "Multiple Steady States in a Radio Frequency Chlorine Glow Discharge." *J. Appl. Phys.*, vol. 69, No. 1, Jan. 1, 1991, pp. 109–114.

(List continued on next page.)

*Primary Examiner*—Randy Gulakowski
*Assistant Examiner*—M. Kornakov
(74) *Attorney, Agent, or Firm*—Ashok K. Janah; Joseph Bach (57) ABSTRACT

A process for etching a substrate 25 in an etching chamber 105, and simultaneously removing etch residue deposited on the surfaces of the walls 110 and components of the etching chamber 105. In one version, a two-stage method of opening a nitride mask layer on the substrate includes a first stage of providing a highly chemically reactive process gas in the chamber 105 to etch the nitride layer 32 and/or an underlying oxide layer 34, and a second stage of providing a less chemically reactive process gas in the chamber to etch the nitride layer 32 and/or the oxide layer 34 at a slower rate than the first stage. The first and second stage process gases may each comprise a fluorine containing gas, with the fluorine ratio of the first gas higher than the fluorine ratio of the second gas.

29 Claims, 6 Drawing Sheets

U.S. PATENT DOCUMENTS

| | | | |
|---|---|---|---|
| 4,576,692 A | 3/1986 | Fukuta et al. | 204/165 |
| 4,705,595 A | 11/1987 | Okudaira et al. | 156/643 |
| 4,738,748 A | 4/1988 | Kisa | 156/643 |
| 4,786,352 A | 11/1988 | Benzing | 156/345 |
| 4,799,991 A | 1/1989 | Dockrey | 438/719 |
| 4,818,326 A | 4/1989 | Liu et al. | 156/345 |
| 4,831,963 A | 5/1989 | Saito et al. | 118/723 |
| 4,863,561 A | 9/1989 | Freeman et al. | 156/646 |
| 4,867,841 A | 9/1989 | Loewenstein et al. | 156/643 |
| 4,876,212 A | 10/1989 | Koury | 437/34 |
| 4,975,144 A | 12/1990 | Yamazaki et al. | 156/643 |
| 4,992,136 A | 2/1991 | Tachi et al. | 156/643 |
| 4,994,410 A | 2/1991 | Sun et al. | 437/192 |
| 5,002,632 A | 3/1991 | Loewenstein et al. | 156/643 |
| 5,013,398 A | 5/1991 | Long et al. | 156/643 |
| 5,035,768 A | 7/1991 | Mu et al. | 156/626 |
| 5,084,126 A | 1/1992 | McKee | 156/345 |
| 5,094,712 A | 3/1992 | Becker et al. | 156/643 |
| 5,110,408 A | 5/1992 | Fujii et al. | 156/643 |
| 5,110,411 A | 5/1992 | Long | 156/656 |
| 5,118,387 A | 6/1992 | Kadomura | 156/657 |
| 5,158,644 A | 10/1992 | Cheung et al. | 156/643 |
| 5,160,407 A | 11/1992 | Latchford et al. | 156/656 |
| 5,164,330 A | 11/1992 | Davis et al. | 437/192 |
| 5,176,792 A | 1/1993 | Fullowan et al. | 156/652 |
| 5,188,980 A | 2/1993 | Lai | 437/193 |
| 5,192,702 A | 3/1993 | Tseng | 437/47 |
| 5,256,245 A | 10/1993 | Keller et al. | 156/643 |
| 5,281,302 A | 1/1994 | Gabric et al. | 156/643 |
| 5,282,899 A | 2/1994 | Balmashonov et al. | 118/723 R |
| 5,312,519 A | 5/1994 | Sakai et al. | 134/1 |
| 5,318,668 A | 6/1994 | Tamaki et al. | 156/662 |
| 5,338,398 A | 8/1994 | Szwejkowski et al. | 156/655 |
| 5,354,417 A | 10/1994 | Cheung et al. | 156/643 |
| 5,356,478 A | 10/1994 | Chen et al. | 134/1 |
| 5,358,601 A | 10/1994 | Cathey | 156/656 |
| 5,378,311 A | 1/1995 | Nagayama et al. | 156/643 |
| 5,382,316 A | 1/1995 | Hills et al. | 156/643 |
| 5,413,954 A | 5/1995 | Aydil et al. | 437/81 |
| 5,431,772 A | 7/1995 | Babie et al. | 156/643.1 |
| 5,443,686 A | 8/1995 | Jones et al. | 216/37 |
| 5,449,411 A | 9/1995 | Fukuda et al. | 118/723 MP |
| 5,514,622 A | 5/1996 | Bornstein et al. | 437/189 |
| 5,521,119 A | 5/1996 | Chen et al. | 437/187 |
| 5,529,197 A | 6/1996 | Grewal | 216/68 |
| 5,620,615 A | 4/1997 | Keller | 438/720 |
| 5,626,775 A | 5/1997 | Roberts et al. | 216/67 |
| 5,644,153 A | 7/1997 | Keller | 257/324 |
| 5,753,533 A | 5/1998 | Saito | 437/192 |
| 5,756,400 A | 5/1998 | Ye et al. | 438/710 |
| 5,767,021 A | 6/1998 | Imai et al. | 438/719 |
| 5,788,799 A * | 8/1998 | Steger et al. | 156/345 |
| 5,843,239 A | 12/1998 | Shrotriya | 134/1.1 |
| 5,866,483 A | 2/1999 | Shiau et al. | 438/720 |
| 5,869,401 A | 2/1999 | Brunemeier et al. | 438/710 |
| 5,874,363 A | 2/1999 | Hoh et al. | 438/721 |
| 5,879,575 A * | 3/1999 | Tepman et al. | 118/723 I |
| 6,067,999 A * | 5/2000 | Hines et al. | 134/1.1 |
| 6,090,718 A | 7/2000 | Soga et al. | |
| 6,125,859 A * | 10/2000 | Kao et al. | 134/1.1 |
| 6,136,211 A * | 10/2000 | Qian et al. | 216/37 |
| 6,270,634 B1 * | 8/2001 | Kumar et al. | 204/192.37 |

OTHER PUBLICATIONS

Hillenius, S.J., et al., "A Symmetric Submicron CMOS Technology," *IEEE*, pp. 252–255, 1986.

PCT Search Report dated Oct. 28, 1999.

PCT Notification of International Search Report dated Feb. 4, 1999.

PCT International Preliminary Examination Report dated Feb. 14, 2000.

U.S. patent application entitled, "Method for Improved Cleaning of Substrate Processing System"; filed Jul. 11, 1997; Ser. No. 08/893,922; Inventors: Kao, et al.

U.S. patent application entitled, "Apparatus for Improved Remote Microwave Plasma source for Use with Substrate Processing Systems"; filed Apr. 23, 1997; Ser. No. 08/839,111; Inventors: Kao, et al.

U.S. patent application entitled, "Method and Apparatus for Determining the Endpoint in a Plasma Cleaning Process"; filed Jul. 2, 1997; Ser. No. 08/887,165; Inventors: Subrahmanyam, et al.

U.S. patent application entitled, "Apparatus and Method for Efficient and Compact Remote Microwave Plasma Generation"; filed Apr. 22, 1997; Ser. No. 08/839,007; Inventor: Bhatnagar.

U.S. patent application entitled, "Method and Apparatus for Pre–stabilized Plasma Generation for Microwave Clean Applications"; filed Nov. 13, 1996; Ser. No. 08/746,658; Inventors: Fong, et al.

U.S. patent application entitled, "Inductively Coupled HDP–CVD Reactor"; filed May 29, 1997; Ser. No. 08/865,018; Inventors: Redeker, et al.

U.S. patent application entitled, "Symmetric Tunable Inductively Coupled HDP–CVD Reactor"; filed Jul. 15, 1996; Ser. No. 08/679,927; Inventors: Redeker, et al.

U.S. patent application entitled, "Apparatus and Methods for Upgraded Substrate Processing System with Microwave Plasma Source"; filed Mar. 5, 1997; Ser. No. 08/811,627; Inventors: Tanaka, et al.

U.S. patent application entitled, "Microwave Apparatus for In–situ Vacuum Line Cleaning for Substrate Processing Equipment"; filed Oct. 30, 1996; Ser. No. 08/741,241; Inventors: Pang, et al.

* cited by examiner

TWO-STAGE SELF-CLEANING SILICON ETCH PROCESS

BACKGROUND

The present invention relates to a method for etching substrates and cleaning the etching chamber.

In the manufacture of integrated circuits, silicon dioxide, silicon nitride, polysilicon, metal silicide, and monocrystalline silicon on a substrate, are etched in predefined patterns to form gates, vias, contact holes, trenches, and/or interconnect lines. In the etching process, a patterned mask layer composed of oxide or nitride hard mask or photoresist, is formed on the substrate using conventional methods. The exposed portions of the substrate between the patterned mask are etched by capacitive or inductively coupled plasmas of etchant gases. During the etching processes, a thin etch residue deposits on the walls and other component surfaces inside the etching chamber. The composition of the etch residue depends, among other things, upon the composition of vaporized species of etchant process gas, the substrate material being etched, and the mask or resist layer applied on the substrate. For example, when tungsten silicide, polysilicon or other silicon-containing layers are etched, silicon-containing gaseous species are vaporized or sputtered from the substrate, and etching of metal layers results in vaporization of metal species. In addition, the resist or mask layer on the substrate is also partially vaporized by the etchant gas to form gaseous hydrocarbon or oxygen species. The vaporized or gaseous species in the chamber condense to form polymeric byproducts composed of hydrocarbon species from the resist; gaseous elements such as fluorine, chlorine, oxygen, or nitrogen; and elemental silicon or metal species depending on the composition of the substrate being etched. The etch byproducts deposit as thin layers of etch residue on the walls and components in the chamber. The composition of the etch residue layer typically varies considerably across the chamber surface depending upon the composition of the localized gaseous environment, the location of gas inlet and exhaust ports, and the chamber geometry.

The compositionally variant, non-homogeneous, etch residue layer formed on the etching chamber surfaces has to be periodically cleaned to prevent contamination of the substrate. Typically, after processing of about 25 wafers, an in-situ plasma "dry-clean" process is performed in an empty etching chamber to clean the chamber. However, the energetic plasma species rapidly erode the chamber walls and chamber components, and it is expensive to often replace such parts and components. Also, erosion of the chamber surfaces can result in instability of the etching process from one wafer to another. The thin compositionally variant etch residue can also make it difficult to stop the in-situ plasma clean process upon removal of the thin layer of residue, resulting in erosion of the underlying chamber surfaces, and making it difficult to clean the hard residue off all the chamber surfaces. For example, the etch residue formed near the chamber inlet or exhaust often has a higher concentration of etchant gas species than that formed near the substrate which typically contains a higher concentration of resist, hard mask, or of the material being etched.

It is difficult to form a cleaning plasma that uniformly etches away the compositional variants of etch residue. Thus after cleaning of about 100 or 300 wafers, the etching chamber is opened to the atmosphere and cleaned in a "wet-cleaning" process, in which an operator uses an acid or solvent to scrub off and dissolve accumulated etch residue on the chamber walls. To provide consistent chamber surface properties, after the wet cleaning step, the chamber surfaces are "seasoned" by pumping down the chamber for an extended period of time, and thereafter, performing a series of runs of the etch process on dummy wafers. The internal chamber surfaces should have consistent chemical surfaces, i.e., surfaces having little or no variations in the concentration, type, or functionality of surface chemical groups; otherwise, the etching processes performed in the chamber produce widely varying etching properties from one substrate to another. In the pump-down process, the chamber is maintained in a high vacuum environment for 2 to 3 hours to outgas moisture and other volatile species trapped in the chamber during the wet clean process. Thereafter, the etch process to be performed in the chamber, is run for 10 to 15 minutes on dummy wafers, or until the chamber provides consistent and reproducible etching properties.

In the competitive semiconductor industry, the increased cost per substrate that results from the downtime of the etching chamber, during the dry or wet cleaning, and seasoning process steps, is highly undesirable. It typically takes 5 to 10 minutes for each dry cleaning process step, and 2 to 3 hours to complete the wet cleaning processes. Also, the wet cleaning and seasoning process often provide inconsistent and variable etch properties. In particular, because the wet cleaning process is manually performed by an operator, it often varies from one session to another, resulting in variations in chamber surface properties and low reproducibility of etching processes. Thus it is desirable to have an etching process that can remove or eliminate deposition of etch residue on the chamber surfaces.

Figure 1A:
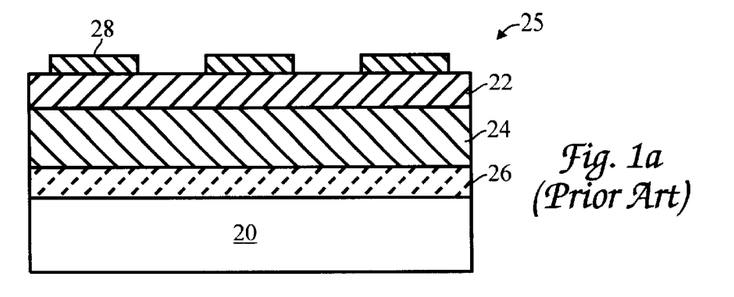
FIG. 1a is a schematic cross-section of a substrate having silicon dioxide, polysilicon, metal silicide and resist layers.
Figure 1B:
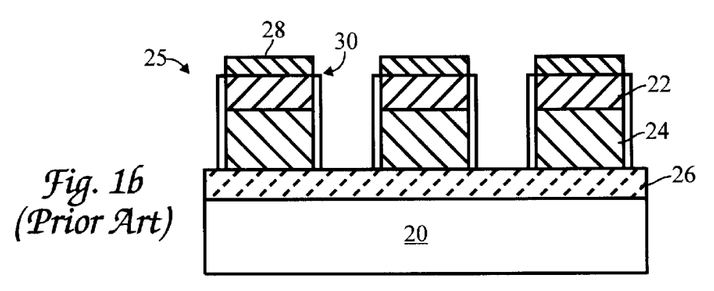
FIG. 1b is a schematic cross-section of the substrate of FIG. 1a after etching of the metal silicide and polysilicon layers.

In semiconductor fabrication, yet another type of problem arises in the etching of multiple layers of materials that have similar constituent elements, for example, silicon-containing materials such as tungsten silicide, polysilicon, silicon nitride, and silicon dioxide. With reference to FIGS. 1a and 1b, a typical polycide structure on a semiconductor substrate 25 comprises metal silicide 22 deposited over doped or undoped polysilicon 24. The polycide structures are formed over silicon dioxide 26, and etched to form the etched features 30. In these structures, it is difficult to obtain a high etching selectivity ratio for etching the metal silicide 22 relative to overlying resist 28, or the underlying polysilicon 24. It is especially desirable to have high etching selectivity ratios for polycide structures that have a convoluted topography, having thicker and thinner portions of metal silicide 22. This requires that the polysilicon 24 be etched sufficiently slowly relative to the rate of etching of the metal silicide 22, that all the polysilicon 24 below the thinner portions of metal silicide 22 are not etched through, before completion of etching of the thicker portion of overlying metal silicide 22. Thus, it is desirable to etch the metal silicide 22 at a faster rate relative to the rate of etching of the polysilicon 24.

Figure 1C:
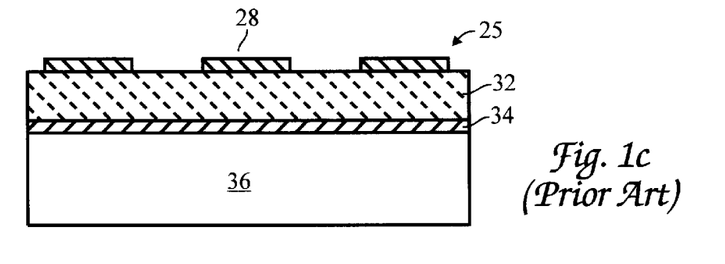
FIG. 1c is a schematic cross-section of a silicon or polysilicon substrate having a mask layer of silicon nitride.
Figure 1D:
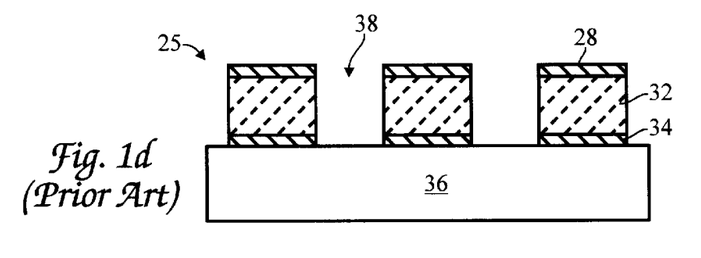
FIG. 1d is a schematic cross-section of the substrate of FIG. 1c after performing a mask open process.
Figure 1E:
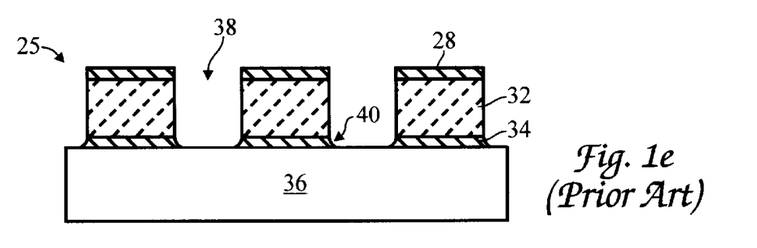
FIG. 1e is a schematic cross-section of the substrate of FIG. 1c after performing a mask open process with poor etch selectivity.

A similar problem arises in the opening or etching of a mask layer of silicon nitride 32, on a thin silicon dioxide layer 34, prior to forming trenches in a substrate comprising silicon 36, as for example shown in FIGS. 1c, 1d and 1e. In this silicon trench isolation (STI) process, the nitride mask 32 is opened 38 to allow for the creation of etched trenches in the silicon 36 that are used, for example, to isolate active MOSFET devices formed on the substrate. The etching selectivity ratio for etching silicon nitride layer 32 relative to silicon dioxide 34 and the underlying silicon 36 has to be very high to stop on the silicon dioxide layer without etching through the silicon dioxide layer 34 and into the silicon substrate 36. FIG. 1d is a generalized depiction of the prior art process. In actuality the etch is not as ideal as shown in FIG. 1d. In fact, generally, the underlying silicon substrate 36 is somewhat etched into and the nitride layer 32 and the silicon dioxide layer 34 is not entirely etched. Maximizing the complete etch of the nitride layer 32 and the silicon dioxide layer 34 while minimizing the etching of the silicon substrate 36 is difficult. The nitride layer 32 must be etched in such a manner as to be highly selective to the oxide layer 34, often termed the pad oxide. Prior techniques have often etched through the oxide layer 34 and then detrimentally into the silicon substrate 36. In addition, poor selectivity control can result in the formation of projecting feet 40 of nitride and/or oxide, as shown in FIG. 1e. Etching through the oxide layer during the mask open process can lead to isotropic etching of the silicon substrate 36.

Conventional shallow trench isolation (STI) processes, in particular the hard mask open processes, result in large amounts of etchant residue being deposited on the substrate and on the chamber walls and surfaces. Typical STI processes require two separate process chambers. One chamber performs the nitride mask open process and another chamber is used for the shallow trench isolation (STI) silicon etch. Due to the large amounts of deposition residue that is generated, a wet cleaning of the substrate between the mask open and the STI etch must be performed. The chambers must also be frequently dry cleaned and wet cleaned.

High etching selectivity ratios are obtained by using process gas compositions that etch the different silicon-containing materials at significantly different etching rates, which depend upon the chemical reactivity of the particular process gas composition with a particular layer. However, etching metal silicide layers with high selectivity to polysilicon, or etching silicon nitride layers with high selectivity to silicon dioxide layers and/or silicon layers, is particularly difficult because all of the layers contain elemental silicon and most conventional etchant plasmas etch the silicon containing layers to form gaseous $SiCl_x$ or $SiF_x$ species. Thus, it is difficult for the etchant plasma to chemically distinguish and preferentially etch the metal silicide layer 22 faster than the polysilicon layer 24, and the silicon nitride layer 32 faster than the silicon dioxide layer 34 or silicon 36. This problem is further exacerbated because the etchant residue for the chamber sidewalls also contains silicon dioxide, and attempts to remove the etchant residue during the polycide etching process, result in substantially lowering the rate of etching selectivity ratio of these layers.

Thus it is desirable to have an etch process that reduces formation of etch residue deposits in the etching chamber while maintaining a high etch selectivity.

SUMMARY

The present invention provides a method of etching a substrate in an etching chamber, that reduces or entirely eliminates the etch residues on the chamber surfaces while maintaining a high etch selectivity. By surfaces in the chamber it is meant any surface inside the chamber enclosure including the walls of the chamber itself and the surfaces of the components in the chamber, such as the gas distributor, electrostatic chuck, focus ring and other components.

In one aspect of the invention a method of etching a substrate in a chamber comprises placing the substrate in the chamber, providing an energized first process gas comprising a first fluorine-containing gas in the chamber to etch the substrate and to remove etchant residue from the surfaces in the chamber, and providing an energized second process gas comprising a second fluorine-containing gas in the chamber to etch the substrate.

In another aspect of the invention, a method of etching a substrate in a chamber comprises placing the substrate having a silicon containing layer in the chamber, providing an energized first process gas in the chamber to etch the silicon-containing layer on the substrate and to remove etchant residue from the surfaces in the chamber, and providing an energized second process gas in the chamber to etch the silicon-containing layer on the substrate.

In another aspect of the invention, a method of simultaneously etching a substrate and cleaning a chamber comprises placing the substrate in the chamber, providing an energized first process gas in the chamber under process conditions selected to simultaneously etch the substrate and clean the chamber, and providing an energized second process gas in the chamber under process conditions selected to simultaneously etch the substrate and clean the chamber.

In another aspect of the invention, a method of forming a nitride mask layer on a substrate in a chamber comprises placing the substrate in the chamber, the substrate comprising a nitride layer and an underlying silicon-containing layer, providing an energized first process gas in the chamber to etch the nitride layer, and providing an energized second process gas in the chamber to etch the nitride layer and the underlying silicon-containing layer.

In another aspect of the invention, a method of etching a substrate in a chamber comprises placing the substrate in the chamber, providing an energized first process gas in the chamber to etch the substrate, the first process gas comprising $SF_6$, and providing an energized second process gas in the chamber to etch the substrate, the second process gas comprising $CF_4$.

DRAWINGS

These features, aspects, and advantages of the present invention will become better understood with regard to the following description, appended claims, and accompanying drawings which illustrate exemplary features of the invention; however, it is to be understood that each of the features can be used in the invention in general, not merely in the context of the particular drawings, and the invention includes any combination of these features, where:

DESCRIPTION

Figure 2:
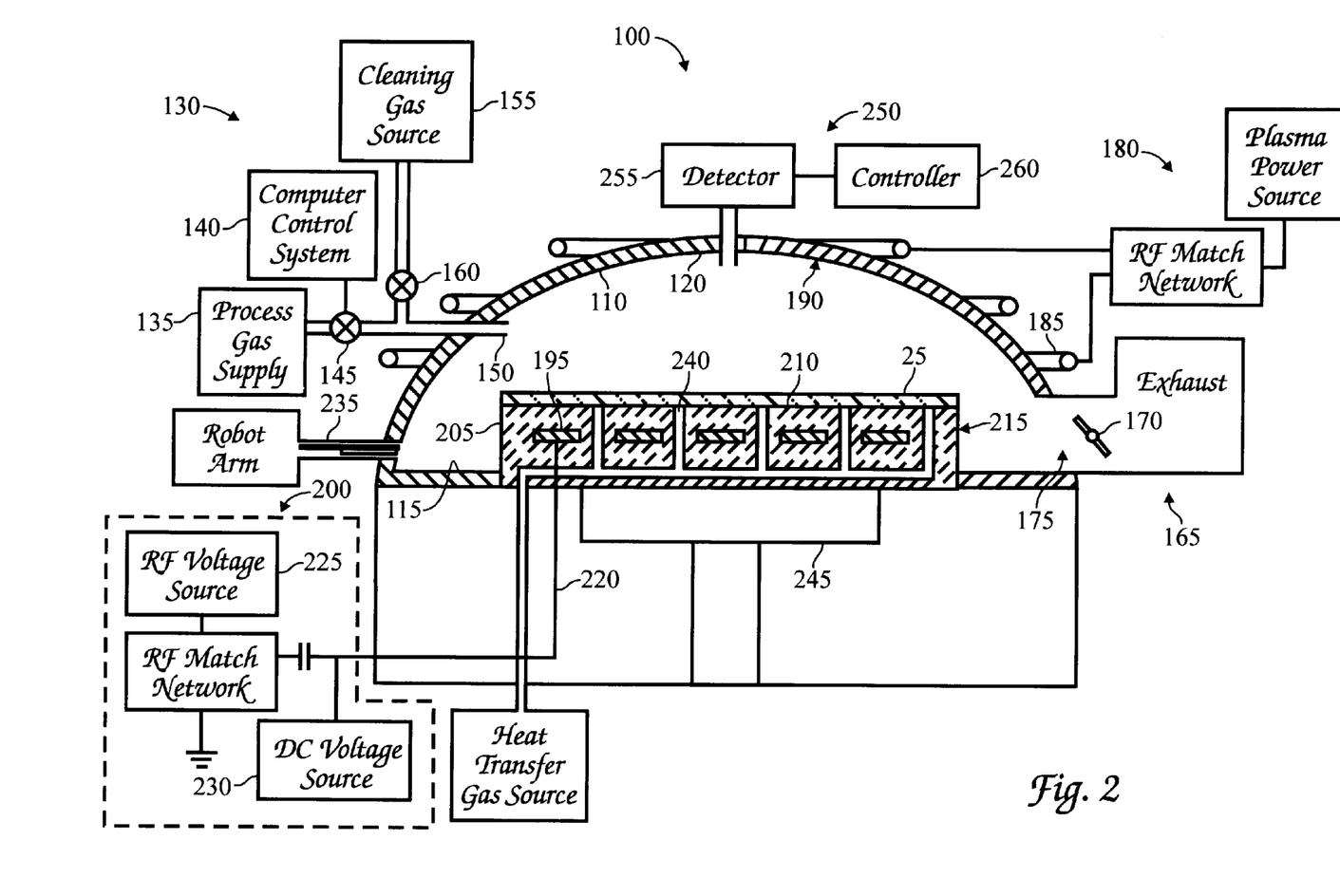
FIG. 2 is a sectional schematic side view of an etching apparatus of the present invention.

The present invention relates to a self-cleaning etch process that maintains a high etch selectivity. An apparatus 100 suitable for etching a substrate 25 according to the present invention, as schematically illustrated in FIG. 2, comprises an enclosed process chamber 105 defining a process zone for processing the substrate. A load-lock transfer area (not shown) is maintained at low pressure for holding a cassette of substrates 25. The particular embodiment of the apparatus 100 shown herein is suitable for processing of substrates 25, such as semiconductor wafers, is provided only to illustrate the invention, and should not be used to limit the scope of the invention. The enclosed chamber 105 has sidewalls 110 and a bottom wall 115 fabricated from any one of a variety of materials including metals, ceramics, glasses, polymers, and composite materials. The process zone defined in the etching chamber 105 is directly above and surrounds the substrate 25 and comprises a volume of at least about 10,000 cm$^3$, and more preferably about 10,000 to about 50,000 cm$^3$. The chamber comprises a ceiling 120 that is flat or rectangular shaped, arcuate, dome-shaped, multiradius dome shaped, a flattened dome, conical, truncated conical, cylindrical, or other combination of such shapes.

Process gas is introduced into the chamber 105 through a gas distribution system 130 that includes a process gas supply 135 and a gas flow control system that comprises a conventional computer system 140 operating a gas flow control valve 145. The gas distribution system 130 can comprise gas outlets 150 located peripherally around the substrate 25 (as shown), or a showerhead mounted on the ceiling of the chamber 105 with outlets therein (not shown). The gas distribution system 130 may further comprise a second gas supply 155 which provides cleaning gas to the chamber 105 via an electronically operated valve 160. Alternatively the process gas and the cleaning gas can be premixed and delivered together to the process chamber. Spent process gas and etchant byproducts are exhausted from the process chamber 105 through an exhaust system 165 (typically including a 1000 liter/sec roughing pump) capable of achieving a minimum pressure of about 10$^{-3}$ mTorr in the chamber 105. A throttle valve 170 is provided in the exhaust 165 to control the flow of spent process gas and the pressure of process gas in the chamber 105. A pumping channel 175 is used to pump gases out of the chamber 105 to provide a more symmetrical and uniform distribution of gaseous species around the surface 105 of the substrate.

A plasma is generated from the process gas introduced into the chamber 105, using a plasma generator 180 that couples an electric field into the process zone of the chamber. A suitable plasma generator 180 comprises an inductor antenna 185 consisting of one or more inductor coils having a circular symmetry with a central axis coincident with the longitudinal vertical axis that extends through the center of the process chamber 105 and perpendicular to the plane of the substrate 25. Preferably, the inductor antenna 185 comprises solenoid coils having from 1 to 10 turns, and more typically from 2 to 6 turns. The arrangement and number of solenoid coils are selected to provide the desired product of current and antenna turns (d/dt)(N·I) near the ceiling 120 to provide a strong inductive flux linkage with close coupling to the plasma and therefore greater plasma ion density in the plasma zone adjacent to the substrate 25, as described in U.S. patent application Ser. No. 08/648,254, which is incorporated herein by reference. When the inductor antenna 185 is positioned near the ceiling 120, the ceiling of the chamber 105 comprises dielectric material which is transparent to RF fields, such as a slab of machined aluminum oxide or silicon dioxide or tiles of silicon or silicon dioxide bonded to one another. In one version, the inductor coil 185 wrapped around the sidewall 110 of the process chamber 105 is a multiradius dome-shaped inductor coil having a "flattened" dome shape that provides increased plasma ion density directly over the substrate center because ion density is affected by local ionization near the inductor coil 185, and a multiradius inductor coil is closer to the substrate center than a hemispherical coil. The frequency of the RF voltage applied to the inductor antenna 185 is typically about 50 KHz to about 60 MHz, and more typically about 13.56 MHz; and the power level of RF voltage applied to the antenna is about 100 to about 5000 Watts.

In another chamber design (not shown), a remote activation source can be used to remotely activate the process gas and/or cleaning gas. In yet another chamber design (not shown), the plasma formed in the plasma zone is enhanced using magnetically enhanced reactors, in which a magnetic field generator (not shown), such as a permanent magnet or electromagnetic coils, are used to apply a magnetic field in the plasma zone to increase the density and uniformity of the plasma. Preferably, the magnetic field comprises a rotating magnetic field with the axis of the field rotating parallel to the plane of the substrate, as described in U.S. Pat. No. 4,842,683, issued Jun. 27, 1989, which is incorporated herein by reference. The magnetic field in the chamber should be sufficiently strong to increase the density of the ions formed in the plasma, and sufficiently uniform to reduce charge-up damage to features such as CMOS gates. Generally, the magnetic field as measured on the surface of the substrate is less than about 500 Gauss, more typically from about 10 to about 100 Gauss, and most typically from about 10 Gauss to about 30 Gauss.

In addition to the inductor antenna 185, one or more process electrodes can be used to accelerate or energize the plasma ions in the chamber 105. The process electrodes include a first electrode 190 forming a wall of the process chamber 105, such as the sidewalls 110 of the chamber. The first electrode 190 is capacitively coupled to a second electrode 195 below the substrate 25. An electrode voltage supply 200 supplies an RF potential that maintains the first and second electrodes 190, 195 at different electrical potentials relative to one another. The first and second electrodes 190, 195 are electrically biased relative to one another by the electrode voltage supply 200 that includes an AC voltage 225 supply for providing a plasma generating RF voltage to the second electrode 195, and a DC voltage supply 230 for providing a chucking voltage to the electrode 195. The AC voltage supply 225 may provide an RF generating voltage having one or more frequencies from 50 KHz to 60 MHz to form a capacitively coupled plasma in the chamber 105. The power level of the RF bias applied to the electrode 195 is typically from about 50 to about 3000 Watts.

The apparatus 100 may further comprise an endpoint detection system 250 for detecting an endpoint of a process being performed in the chamber 105. Generally, the endpoint detection system comprises one or more detectors 255 in communication with a controller 260 to detect and monitor a process variables of the process being conducted in the process chamber 105 and endpoint detection software, for example interferometric or plasma emission software, in the controller 260. For example, optical emission detection for endpoint determination is discussed in Chapter 16, of *Silicon Processing for the VLSI Era, Volume* 1: *Process Technology*, by Stanley Wolf et al., Lattice Press (1986), which is incorporated herein by reference. An example of an endpoint detection method is disclosed in commonly-owned and assigned U.S. patent application Ser. No. 08/854,508, filed on May 12, 1997, and entitled "Method and Apparatus for Monitoring Process Using Multiple Parameters of a Semiconductor Wafer Processing System," which is also incorporated herein by reference. The endpoint detection method is used to determine when a particular thickness of a layer has been processed and to change process conditions in response to the determination. The desired thickness can be predetermined and input into the controller 260.

Etching & Cleaning Process

Operation of the etching chamber 105 to etch one or more of the layers on the substrate 25, and simultaneously clean the etching chamber, will now be described. The substrate 25 typically comprises a semiconductor material, such as a silicon or gallium arsenide wafer, with a plurality of layers comprising, for example, an underlayer of silicon dioxide that functions as a gate oxide layer for MOS transistors, and an overlayer of polycide, which is a combination of tungsten silicide and underlying polysilicon layers. The metal silicide layer on the substrate 25 comprises, for example, tungsten, tantalum, titanium, or molybdenum silicides. A polysilicon layer is below the metal silicide layer and over a silicon dioxide layer. A patterned mask layer, such as photoresist, or a silicon dioxide or silicon nitride hard mask, is formed on the substrate 25. The exposed portions of the substrate between the mask layer are etched to form features, such as for example, contact holes for fabricating gate electrodes for MOS transistors; polycide interconnecting features that are typically used as gate electrodes; and vias which are multilayer metal structures used to electrically connect two or more electrically conductive layers separated by insulating silicon oxide/nitride layers. In another example, the substrate comprises silicon nitride layers and/or silicon oxide layers on a silicon (doped or undoped) substrate. The substrate may alternatively comprise a silicon nitride, or the like, layer overlying a silicon dioxide, or the like, layer on a silicon substrate 25.

The substrate 25 is transferred using a robot arm 235 from a load-lock transfer chamber through a slit valve and into the chamber 105. A lift finger assembly (not shown) has lift fingers that extend through lift finger openings in the chuck 215 to receive or lift the substrate 25 off the chuck 215. The robot arm 235 places the substrate 25 on the tips of the lift fingers (not shown) that are elevated by the pneumatic lift mechanism 245 to extend about 2 to 5 centimeters above the surface of the chuck 215. The pneumatic mechanism, under the control of a computer system, lowers the substrate 25 onto the electrostatic chuck 215, and helium is supplied through apertures 240 in the chuck to control the temperature of the substrate 25.

A process gas comprising etchant gas for etching the substrate is introduced into the chamber 105 through the gas outlet 150, and the chamber is typically maintained at a pressure ranging from about 0.1 to about 400 mTorr. Suitable etchant gases for etching layers on the substrate 25, include for example, HCl, $BCl_3$, HBr, $Br_2$, $Cl_2$, $CCl_4$, $SiCl_4$, $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, $O_2$, $N_2$, He, and mixtures thereof. The etchant gas is selected to provide high etch rates, and highly selective etching of the particular layers that are being etched. When multiple layers are sequential etched, first, second, third, etc., etchant gas compositions are sequentially introduced into the chamber to etch each particular layer. Referring to FIG. 2, a plasma is energized from the etchant gas using the plasma generator 180 by inductively and/or capacitively coupling energy into the chamber 105. For example, the plasma can be formed by applying an RF source current to the inductor antenna 185 encircling the chamber 105, and applying an RF bias voltage to the electrodes 190, 195. The etchant gas ionizes in the applied electric field to form ions and neutrals that etch the layer on the substrate 25 to form volatile gaseous species that are exhausted from the chamber 105.

U.S. patent application Ser. No. 08/969,122, filed on Nov. 12, 1997, and incorporated herein by reference, describes a process that allows etching of one or more layers on a substrate 25 and simultaneous cleaning of the plasma etching chamber 105 in which the etching process is performed, without stopping the etching process. In one or more of the etch process stages, a cleaning gas is added to the etchant gas in a volumetric flow ratio selected so that the etching residue formed in any one of the etching stages, or the residue formed in all of the etching stages is removed or substantially entirely removed during the etching process. In one version, the etchant gas comprises one or more of $Cl_2$, $N_2$, $O_2$, HBr, or He—$O_2$; and the cleaning gas comprises one or more of $NF_3$, $CF_4$, or $SF_6$. It has been discovered that combinations of these gases provide unique and unexpected etching and cleaning properties. In another version, a silicon nitride layer 32 on a silicon dioxide layer 34, is etched to form a mask (prior to a shallow trench isolation of the underlying silicon 36). A plasma of $Cl_2$, $O_2$, and $SF_6$ is used to etch the silicon nitride layer 32, while simultaneously cleaning the chamber walls. The volumetric flow of $Cl_2:O_2:SF_6$ is selected to remove substantially all the etchant residue generated by etching at least 2000 substrates in the chamber, without performing separate cleaning steps for cleaning the chamber.

Figure 3A:
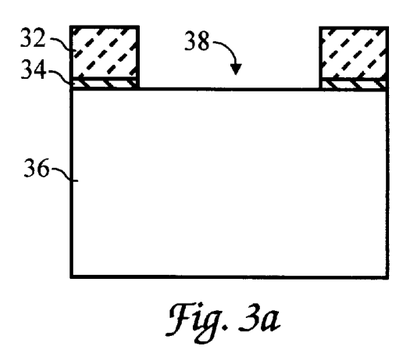
FIGS. 3a through 3e are schematic sectional side views of a substrate undergoing a shallow trench isolation process.
Figure 3B:
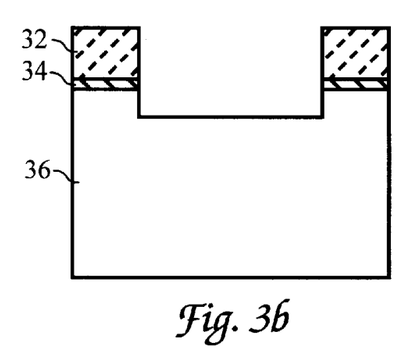
Figure 3C:
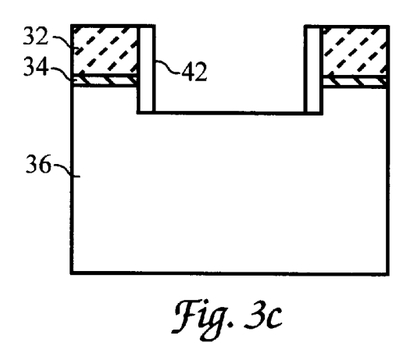
Figure 3D:
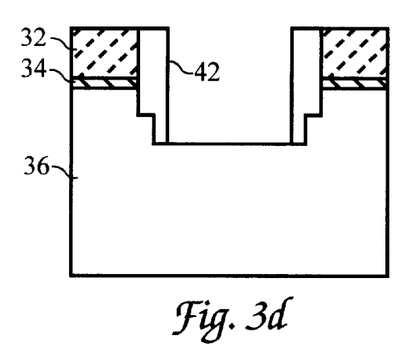
Figure 3E:
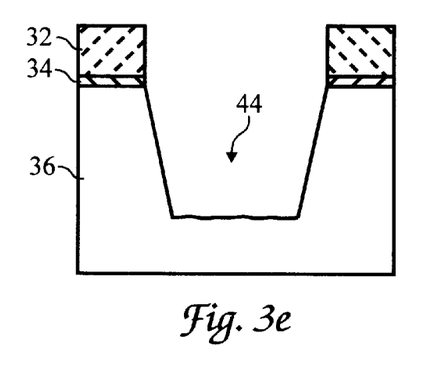

FIGS. 3a–3e schematically illustrate the shallow trench isolation (STI) process. FIG. 3a shows a silicon substrate 36 where a nitride mask layer 32 and a thin pad oxide layer (e.g. a silicon dioxide layer) 34 have been opened 38. A small amount of silicon 36 is then etched using a process gas comprising, for example, $CF_4$ and Ar, as shown in FIG. 3b. During the etch process, a thin coating 42 of polymer, for example $C_xF_yO_z$ or $Si_xO_y$, is deposited on the sidewalls to cover and passivate the sidewall silicon surface, as shown in FIG. 3c. The trench is then further etched and further passivated, as shown in FIG. 3d. The process continues and a resulting trench 44 as shown in FIG. 3e is produced after the deposited passivating layer has been removed, for example with a mixture of sulfuric acid and hydrogen peroxide at about a one to one ratio and a wet laboratory dip in HF. The shallow trench isolation (STI) can be an in situ process in which the mask open process and the silicon etch process occur in the same chamber or can be an ex situ process where the mask open process and the silicon etch process are performed in separate process chambers.

Figure 4A:
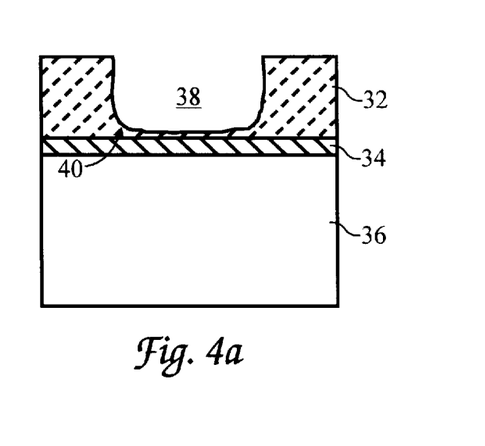
FIGS. 4a through 4c are schematic sectional side views of a nitride mask open process using a process gas comprising $SF_6$.

While the nitride mask open process described in U.S. patent application Ser. No. 08/969,122 is highly useful and advantageous over the prior art processes, particularly in terms of its removal of etchant residue from the chamber surfaces, the process is limited in its control of the resulting shallow trench profile. FIGS. 4a through 4c schematically demonstrate an open mask situation that can occur when utilizing this mask open process. As shown in FIG. 4a, the nitride layer, is etched to create a mask opening 38 that will be used to form the trench in an shallow trench isolation (STI) process such as the one discussed above in connection with FIGS. 3a–3e. The nitride layer 32 is etched in accordance with a resist pattern (not shown) in a process chamber 105. A process gas, for example the $Cl_2$, $O_2$, and $SF_6$ composition of Ser. No. 08/969,122, is introduced into the chamber and energized therein (or is remotely energized and then introduced into the chamber 105) to simultaneously etch the layer or layers and to clean etchant residue deposited onto the process chamber 105 surfaces. If the supply of process gas is stopped, or if the process is otherwise stopped, when the nitride layer 32 is etched to or near the degree shown in FIG. 4a, or shortly thereafter, for example when the pad oxide 34 is etched into or etched through, the resulting mask openings 38 will have feet 40 that adversely affect the critical dimension control over the size and the shape of the subsequently formed trench 44.

Figure 4B:
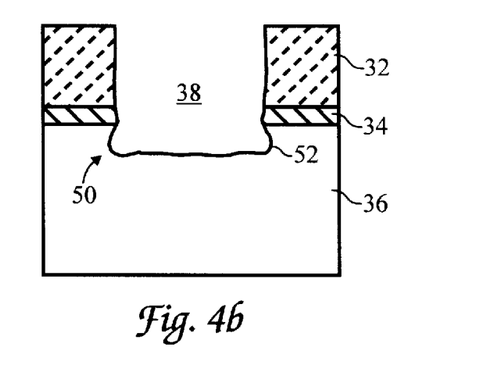
Figure 4C:
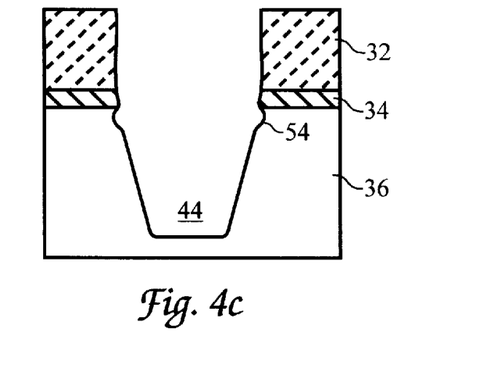

To reduce the size of the feet 40, the process may be allowed to continue to etch away the feet 40. However, due to the spontaneous and high chemical reactivity of $SF_6$ with silicon, once the pad oxide layer is at least partially etched through, an isotropic etch 50 of the underlying silicon substrate 36 may occur, as exemplarily shown in FIG. 4b. This uncontrollable isotropic etch 50 limits the quality and the reproducibility of the subsequently formed shallow trench 44. The shallow trench isolation (STI) process is a passivating deposition controlled process, as discussed above. The passivation defines the trench profile. By etching at least partially into the silicon 36, the upper portion of the later formed shallow trench 44 will have been etched without the passivating coating 42 being deposited on the sidewall. It is believed that this results in a greater etching into the sidewall during the isotropic etch 50 than would occur during a controlled shallow trench isolation (STI) etch. In addition, the uncontrollable isotropic etch 50 can create undesirable shapes 52 in the silicon 36. These two factors can combine to result in an shallow trench isolation (STI) etch formation of a shallow trench 44, as shown in FIG. 4c, that is of an uncontrollable and unreproducible shape 54. Furthermore, an unsmooth trench shape 54, such as the one shown in FIG. 4c, is unfavorable for trench backfilling processes. Sharp top corners can cause/stress induced leakage currents, gate oxide thinning can lead to poor oxide reliability, and gate wrap around can cause subthreshold kink and high transistor off current.

Two-stage etching of silicon layers

Figure 5A:
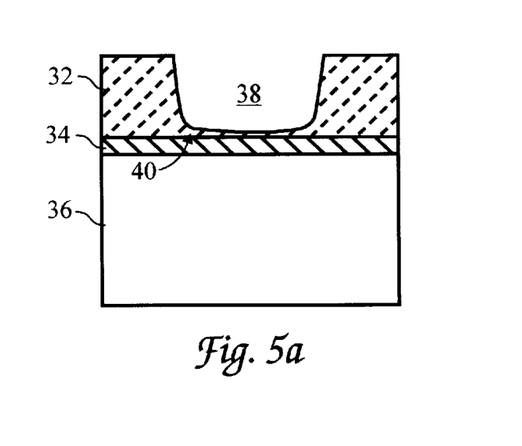
FIGS. 5a through 5c are schematic sectional side views of a nitride mask open process using a two-stage process.
Figure 5B:
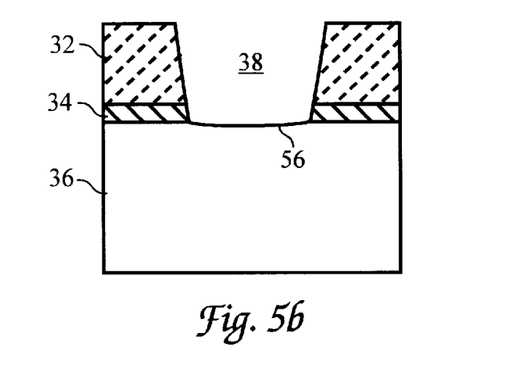
Figure 5C:
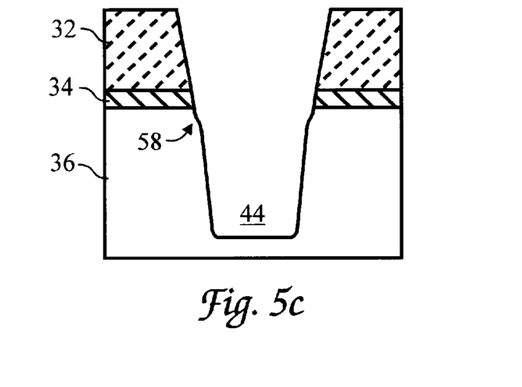

In one version of the present invention, two-stage etching of the nitride layer 32 and/or the pad oxide layer 34 is performed. In the first stage, as shown in FIG. 5a, a relatively highly chemically reactive etching process etches the nitride layer 32 and simultaneously cleans the etchant residue from process chamber surfaces. When the nitride layer is nearly etched through, etched through, or just after it has been etched through or when the pad oxide layer is nearly etched through, etched through, or just after it is etched through, a second etching stage, as shown in FIG. 5b, less aggressively etches the feet 40 or other residual components of the nitride and/or pad oxide layers 32, 34 and simultaneously cleans etchant residue from the chamber surfaces. By "etch through" it is meant that at least a portion of the entire thickness of a layer has been etched or that at least a portion of an underlying layer is exposed. This second etching stage substantially avoids an isotropic etch of the silicon substrate 36. As shown in FIG. 5b, a resulting mask opening 38 is formed, and in which the silicon 36 is only slightly 56, if at all, etched into. Alternatively to that shown in FIG. 5b, the etch of the mask can be terminated before the pad oxide layer is etched through. In either case, a clean chamber 105 and an advantageous mask opening 38 result. FIG. 5c shows a shallow trench 44 formed by using a the mask formed by the two-stage mask open process.

The highly reproducible opening 38 formed by the two-stage process allows for a more controllable and reproducible shallow trench 44. Additionally, and unexpectedly, the resulting shallow trench 44 has an initial outward (in relation to the silicon 36) curvature 58 which is a desirable trench shape because the resulting top corner rounding reduces leakage current. It is believed that the prevention of significant isotropic etching of the top of the silicon 36 allows for passivation control of the sidewalls of the top of the trench 44 during the shallow trench isolation (STI) process. This results in the desirable shape. Additionally, this process allows for a more rounded bottom corner which provides greater device reliability. Also unexpectedly, and counterintuitively, the use of a less chemically reactive etching stage still results in a simultaneous cleaning of the chamber. This process also prevents undercutting of the nitride layer without the need to coat the nitride with a polymer layer that makes the chamber more difficult to clean.

The volumetric flow ratio of gas components in the process gas is selected to remove the etchant residue generated from processing at least 1000 substrates, and more preferably at least 2000 or 3000 substrates, without performing a separate cleaning step for cleaning the chamber 105 in between processing of the substrates. A suitable volumetric flow ratio of process gas components and suitable process conditions remove substantially all the etchant residues on the chamber surfaces without eroding the chamber surfaces. The synergism of etching the substrate 25 and simultaneously removing the etching residues from the surfaces in the chamber 105 (without terminating the etching process or requiring separate cleaning or conditioning steps) provides significantly improved process stability from substrate to substrate, and increased process throughput.

The chamber treatment process of the present invention has been found to uniformly remove etch residues, irrespective of their thickness or chemical stoichiometry, during performance of an etching process. Prior art cleaning processes, particularly those performed by an operator, are not performed simultaneously with etching and furthermore often fail to uniformly clean and remove the etch residue deposits formed on chamber surfaces. Build-up of etchant deposits on the chamber surfaces, result in flaking off the etchant deposits and contamination of the substrate 25 etched in the chamber. The etch residue is compositionally variant and non-homogeneous. Due to this non-homogeneous nature and due to the inconsistent deposition of etch residue (as opposed to the homogeneous and constant residue of deposition processes), the energetic plasma species rapidly erode the chamber walls and chamber components, and it is expensive to often replace such parts and components. Also, erosion of the chamber surfaces can result in instability of the etching process from one wafer to another. The thin compositional variant etch residue can also make it difficult to stop the in-situ plasma clean process upon removal of all the residue, resulting in erosion of the underlying chamber surfaces, and making it difficult to clean the hard residue off all the chamber surfaces. For example, the etch residue formed near the chamber inlet or exhaust often has a high concentration of etchant gas species than that formed near the substrate which typically contains a higher concentration of resist, hard mask, or of the material being etched. By uniformly removing the etch residues formed across substantially all of the chamber surfaces, such contamination and resultant reduced substrate 25 yields, are substantially minimized.

The present cleaning process also results in much less erosive damage to the chamber compared to conventional in-situ plasma cleaning steps, because of the reduced energy levels of the plasma in the etching chamber. This was difficult to accomplish in prior art processes, in which high powered plasmas used to remove the residue deposits also resulted in extensive erosion of chamber surfaces and components. By reducing the need to replace chamber components, the cost of operating the chamber 105 and the cost per substrate 25 are significantly reduced. Furthermore, the activated cleaning gas can be used to efficiently clean an chamber 105 in-situ during etching of substrates 25, rather than stopping processing to wet clean the chamber walls and components, thereby reducing chamber down time, increasing etching throughput and further reducing costs per substrate. The cleaning process is expected to increase chamber lifetimes by a factor of at least 2, and also increase substrate yields by reducing the deposition of flaked-off etchant byproducts onto the substrate.

The cleaning process removes chemically-adhered etchant deposits from the surfaces in the chamber 105, and restores the original chemical reactivity and surface functional groups of these surfaces, without requiring a chamber conditioning process after the cleaning process. The cleaning and treatment process is also particularly useful for cleaning etch residue that is strongly adhered to, or chemically reacted with chamber surfaces.

In one exemplary embodiment, the $SF_6$ is used in the first stage and $CF_4$ is used in the second stage. $SF_6$ provides a nonpolymeric precursor and therefore has little deposition. Furthermore, $SF_6$ is a highly chemically reactive etchant that cleans the undesirable etchant residue in the chamber 105. To perform this process, a substrate 25 is transferred into the chamber 105. In the first etching stage, process gas comprising $SF_6$ is introduced into the chamber and is energized to form a plasma to etch the nitride layer 32 in accordance with the pattern of an overlying resist layer. The inductive source power may be from about 300 to about 1500 W, preferably from about 600 to about 1200 W, the bias power may be maintained from about 50 to about 350 W, preferably from about 70 to about 100 W, and the chamber pressure may be from about 5 to about 70 mTorr. The process gas may have a total flow from about 10 to about 1000 sccm, preferably from about 50 to about 300 sccm and may comprise gases other than the $SF_6$, such as for example, Ar, $Cl_2$, oxygen-containing gas, and HBr in order to optimize etch uniformity, profile angle and critical dimension control. In one version the process gas comprises $SF_6$, Ar, oxygen. In another version, the process gas comprises $SF_6$, Ar, oxygen and HBr. The volumetric flow ratio of $SF_6$ to the other components in the process gas may be from about 5:1 to about 1:10, and preferably from about 2:1 to about 1:3.

Figure 6:
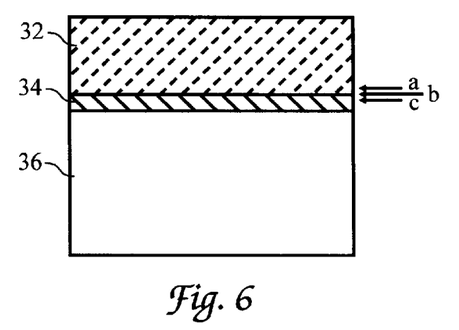
FIG. 6 is a schematic sectional side view of a substrate containing a nitride layer and depicting different endpoint locations.

This first etching stage continues for a predetermined amount of time or until a predetermined thickness of the layer or layers has been etched. In one version, an endpoint detection system 250 is used to determine when to terminate or otherwise alter the first etching stage. FIG. 6 illustrates different thicknesses at which the first etching stage can be terminated or otherwise altered. The desired thickness can be predetermined and the controller 260 can be input with one the predetermined thickness. For example, the controller 260 can determine when an amount of etching to level a has occurred. At this level, the nitride layer 32 has not been etched through and the feet 40 would comprise the nitride layer material. Alternatively, the $SF_6$ process gas can be used to etch through the nitride layer 32 (level b) and to etch somewhat into the pad oxide layer 34 (level c). In the case of levels b and c, the feet 40 will comprise material from the nitride layer 32 and material from the pad oxide layer 34.

When the endpoint detection system 250 detects the end of the first stage, the controller 260 causes the termination of the first etching stage and the beginning of the second etching stage. In the second etching stage, process gas comprising $CF_4$, for example, is introduced into the chamber and is energized to form a plasma to etch or over etch the nitride layer 32 and to optionally etch or over etch the pad oxide layer 34. The inductive source power may be from about 300 to about 1500 W, preferably from about 600 to about 1200 W, the bias power may be maintained from about 50 to about 350 W, preferably from about 70 to about 100 W, and the chamber pressure may be from about 5 to about 70 mTorr. The process gas may have a total flow from about 10 to about 1000 sccm, preferably from about 50 to about 300 sccm and may comprise gases other than the $CF_4$, such as for example, Ar, $Cl_2$, oxygen-containing gas, and HBr in order to improve etch uniformity and selectivity to photoresist and silicon. In one version the process gas comprises $CF_4$ alone. In another version, the process gas comprises $CF_4$ and Ar. The volumetric flow ratio of $CF_4$ to the other components in the process gas may be from about 1:0 to about 1:10, and preferably from about 2:1 to about 1:2.

Figure 7A:
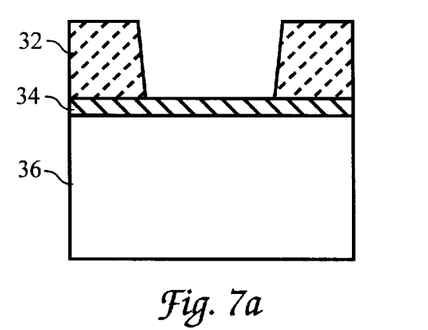
FIG. 7a through 7c are schematic sectional side views of three substrates after being processed in a two-stage nitride mask open process to different degrees.
Figure 7B:
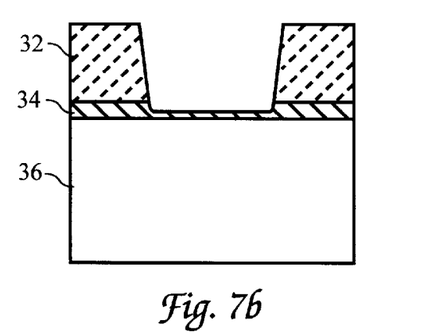
Figure 7C:
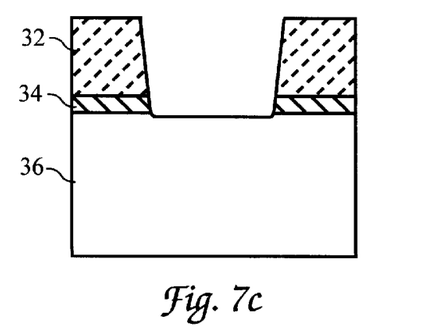

The first and second stages can be tailored, based on endpoint selection and process conditions to produce one of the mask products shown in FIGS. 7a–7c. In FIG. 7a, the pad oxide layer is only slightly, if at all, etched into. In FIG. 7b, substantially all of the nitride layer 32 is etched through and the pad oxide layer 34 is etched into. In FIG. 7c, the silicon 36 is only slightly, if at all, etched. All of these masks are easily reproducible and can be used to etch the shallow trenches 44 as shown in FIG. 5c. This tailoring feature allows for the exact mask shape to be controlled by adjusting the predetermined endpoint level or by adjusting process conditions for the first and/or second stages.

Specific examples of process conditions for the first etching stage and the second etching stage are given in Table 1 below. These examples are not intended to limit the scope of the invention.

TABLE I

| Ex # | Stage | SF$_6$ (sccm) | CF$_4$ (sccm) | Ar (sccm) | HBr (sccm) | Source Power (watts) | Bias Power (watts) | Pressure (mTorr) |
|---|---|---|---|---|---|---|---|---|
| 1 | 1 | 75 | 0 | 75 | 0 | 1200 | 70 | 70 |
|   | 2 | 0 | 80 | 120 | 0 | 1000 | 100 | 70 |
| 2 | 1 | 75 | 0 | 75 | 35 | 600 | 100 | 30 |
|   | 2 | 0 | 80 | 120 | 0 | 1000 | 100 | 70 |

Figure 8A:
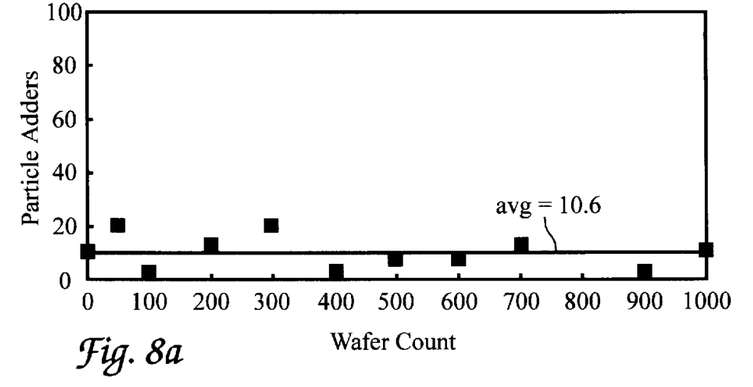
FIG. 8a is a graph showing particle adder counts taken at 100 substrate intervals during a 1000 substrate "burn-in" test of the two-stage process.
Figure 8B:
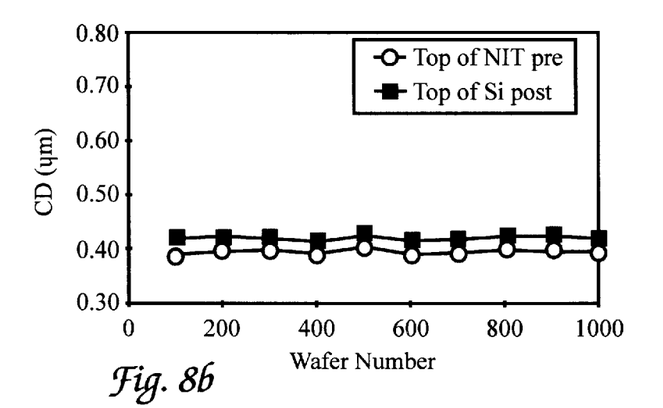
FIG. 8b is a graph showing nitride open and shallow trench isolation (STI) critical dimension variations over the 1000 substrate "burn-in"
Figure 8C:
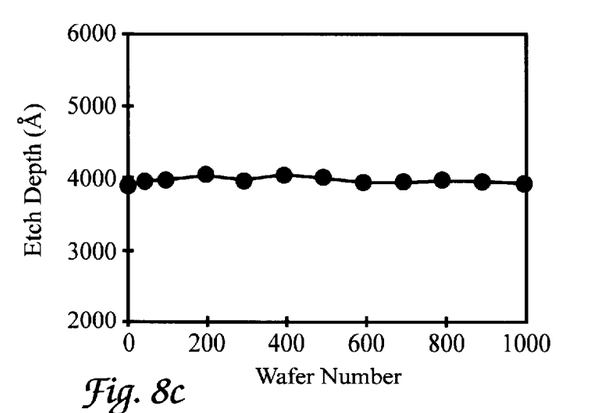
FIG. 8c is a graph showing shallow trench isolation (STI) etch rate uniformity over the 1000 substrate "burn-in"

An additional benefit of this process is that etchant residue is removed from the chamber surfaces during the etching of the layers on the substrate. In order to verify the cleanliness of the process, three tests were performed. Process chamber 105 wall deposition thickness measurement was performed using a quartz crystal microbalance (QCM) unit. The QCM results showed no observable deposition during the in situ shallow trench isolation (STI) etch. A 50 substrate coupon test was also conducted. The coupon test reconfirmed no visual traces of residue on the chamber surfaces. A 1000 wafer "burn-in" was also performed. In the manufacture of integrated circuits, device yield and performance may be directly correlated with particle contamination. During the "burn-in", the process was run on silicon particle monitor wafers after every hundred wafer etch, and then the particle counted and distribution were measured. FIG. 8a shows that the particle adder count was stable throughout the "burn-in" at an average value of 10.6 particles. This low particle count is further evidence of a clean chamber. Furthermore, metallic contamination was collected during the "burn-in" and analyzed. All contamination data for Al, Mg, Na, K, Ca, Ti, Cr, Mn, Ni, Fe, Cu, and Zn were within acceptable levels. For example, Al contamination level was $10^{11}$ atoms/cm$^2$ which is an order of magnitude lower than conventional silicon etch processes. The "burn-in" also showed the process to be highly stable. Wafer to wafer critical dimension (CD) variations for nitride open and shallow trench isolation (STI) etch were stable throughout the "burn-in" as shown by FIG. 8b. Etch rate uniformity was also demonstrated, as shown in FIG. 8c.

Different process gas compositions may be used in the first and second stages of the etching process. Gases or combinations of gases other than SF$_6$ in the first stage and/or CF$_4$ in the second stage can be used, provided the first stage uses a process gas that is more chemically reactive with the nitride and/or oxide layers 32, 34 than the second stage process gas and provided the second stage process gas effectively etches the nitride and/or pad oxide layers 32, 34 without substantial isotropic etching of the underlying silicon 36. For example, other fluorine containing gases that have differing numbers of fluorine atoms can be respectively used in the first and second stages.

In one version, the first stage process gas comprises a fluorine-containing gas compound and the second stage process gas comprises a fluorine-containing gas compound having a fluorine atom to non-fluorine atom ratio (hereinafter referred to as "fluorine ratio") less than the first stage fluorine containing gas compound. For example, SF$_6$ has a fluorine ratio (6) which is greater than the fluorine ratio (4) of CF$_4$. The following is a list of exemplary (but not exhaustive) fluorine containing gases and there respective normalized fluorine ratios: F$_2$ (inf), SF$_6$ (6), CF$_4$ (4), CF$_3$ (3), NF$_3$ (3), C$_2$F$_6$ (3), C$_3$F$_8$ (2.67), C$_4$F$_{10}$ (2.5), C$_4$F$_8$ (2), C$_2$HF$_5$ (1.67), CHF$_3$ (1.5), HF (1), C$_2$H$_4$F$_6$ (1), CH$_3$F$_3$ (0.75), CH$_2$F$_2$ (0.67), C$_2$H$_2$F$_2$ (0.5), CH$_2$F (0.33), CH$_3$F (0.25). In one version, the first stage process gas may comprise SF$_6$ and the second stage process gas may comprise one or more fluorine containing compounds with a fluorine ratio less than SF$_6$, such as one or more of CF$_4$, CF$_3$, CHF$_3$, NF$_3$, C$_2$F$_6$, C$_3$F$_8$, C$_4$F$_{10}$, C$_4$F$_8$, C$_2$HF$_5$, HF, C$_2$H$_4$F$_6$, C$_2$H$_2$F$_2$, CH$_2$F, CH$_3$F, or the like. In another version, the second stage process gas may comprise CF$_4$ and the first stage process gas may comprise one or more fluorine containing compounds with a fluorine ratio greater than CF$_4$, such as one or more of F$_2$, SF$_6$, or the like. In another version, the first and second stage process gases can be selected so that the first stage process gas comprises a fluorine containing compound with a fluorine ratio greater than the fluorine ratio of the fluorine containing compound in the second stage process gas by at least about 1.5. For example, the first stage process gas may comprise CF$_4$ and the second stage process gas may comprise CHF$_3$, with the fluorine ratios differing by 2.5. Non-fluorine containing etchant gases having differing etching chemical reactivities could also be used. Furthermore, the first and second stages could differ only in process conditions or process parameters.

Figure 9A:
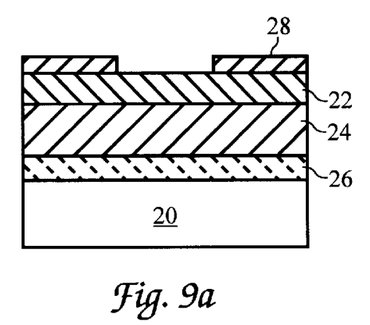
FIGS. 9a–9c are schematic sectional side views of a metal suicide layer etch using a two-stage etch process.
Figure 9B:
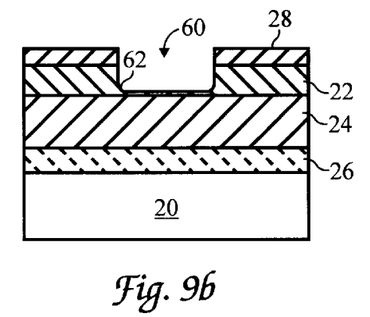
Figure 9C:
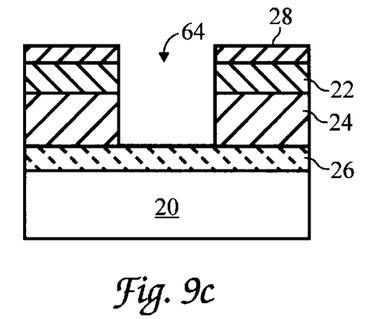

The present invention is applicable to etching processes other than shallow trench isolation (STI) processes. For example, the two-stage process can be used when it is desirable to etch two adjacent or nearby silicon-containing layers at varying or critical etch rates. For example, high etch selectivity is desirable when etching a metal silicide layer 22 overlying a polysilicon layer 24. As shown in FIGS. 9a–9c, a typical multilayer polycide structure on a semiconductor substrate 25 comprises metal silicide layers 22 deposited over doped or undoped polysilicon layers 24. The polycide layers are formed over silicon dioxide layers 26, and etched to form the etched features 30. In these multilayer structures, it is difficult to obtain a high etching selectivity ratio for etching the metal silicide layer 22 relative to the overlying resist layer 28, or the underlying polysilicon layer 24. It is especially desirable to have high etching selectivity ratios for polycide structures that have a non-planar and highly convoluted topography, where the portion of the conformal metal silicide layer 22 between the etched features is thicker than the portion of the metal silicide layer 22 on top of the etched features (not shown). At a certain time during the etching process, the thinner metal silicide layer 22 is etched through and etching of the underlying polysilicon layer 24 begins, while the metal silicide layer 22 is still being etched. The etching of the metal silicide layer 22 without excessive etching of the polysilicon layer 24 can be achieved by using the two-stage process of the present invention. For example, in a first stage, as shown in FIG. 9b, a highly chemically reactive fluorine-containing process gas 60 can be used to aggressively etch the metal silicide layer 22. This will result in the formation of metal silicide feet 62. When the metal silicide layer 22 is nearly etched through, etched through, or just beyond being etched through (as determined by the endpoint detection system 250), the first stage can be terminated and a second process gas can be introduced. For example, a less chemically reactive fluorine-containing process gas 64 can be introduced to more slowly and gently etch into the polysilicon layer 24 and to etch away the feet 62 or other residual pieces of the metal silicide 22 without substantial undercutting of the polysilicon layer 24.

The present invention has been described with reference to certain preferred versions thereof; however, other versions are possible. For example, the treatment and cleaning process of the present invention can be used for treating chambers for other applications, as would be apparent to one of ordinary skill. For example, the process can be applied, as would be apparent to one of ordinary skill in the art, to treat sputtering chambers, ion implantation chambers, or deposition chambers, or in combination with other cleaning processes. Therefore, the spirit and scope of the appended claims should not be limited to the description of the preferred versions contained herein.

What is claimed is:

1. A method of etching a substrate and cleaning surfaces of a chamber, the method comprising:

placing the substrate in the chamber;

in a first stage, providing an energized first process gas in the chamber to etch the substrate and to simultaneously remove etchant residue from the surfaces of the chamber, the first process gas comprising a first fluorine-containing gas compound; and in a second stage, providing an energized second process as in the chamber to etch the substrate and to simultaneously remove etchant residue from the surfaces of the chamber, the second process gas comprising a second fluorine-containing gas compound.

2. A method according to claim 1 wherein the second fluorine-containing gas compound has a ratio of fluorine to other constituent species that is less than a fluorine to other constituent species ratio of the first fluorine-containing gas compound.

3. A method according to claim 1 wherein the second fluorine-containing gas compound has a ratio of fluorine to other constituent species that is less than a fluorine to other constituent species ratio of the first fluorine-containing gas compound by at least about 1.5.

4. A method according to claim 1 wherein the first process gas comprises $SF_6$.

5. A method according to claim 1 wherein the second process gas comprises $CF_4$.

6. A method according to claim 1 wherein the first process gas comprises $SF_6$ and the second process gas comprises $CF_4$.

7. A method of etching a substrate and cleaning surfaces in a chamber, the method comprising:

placing the substrate in the chamber, the substrate comprising a first silicon-containing layer comprising a first silicon-containing material and a second silicon-containing layer comprising a second silicon-containing material;

in a first stage, providing an energized first process gas in the chamber to etch the first silicon-containing layer and to remove etchant residue from the surfaces in the chamber, the first process gas comprising a first fluorine-containing gas compound; and in a second stage, providing an energized second process gas in the chamber to etch the second silicon-containing layer on the substrate and to remove etchant residue from the surfaces in the chamber, the second process gas comprising a second fluorine containing gas compound.

8. A method according to claim 7 wherein the first silicon-containing layer comprises a silicon nitride layer and wherein the first process gas etches the silicon nitride layer.

9. A method according to claim 7 wherein the second fluorine-containing gas compound has a ratio of fluorine to other constituent species that is less than a fluorine to constituent species ratio of the first fluorine-containing gas compound by at least about 1.5.

10. A method according to claim 7 wherein the first process gas comprises $SF_6$.

11. A method according to claim 7 wherein the second process gas comprises $CF_4$.

12. A method of simultaneously etching a substrate and cleaning a chamber, the method comprising:

placing the substrate in the chamber;

in a first stage, providing an energized first process gas in the chamber under process conditions selected to simultaneously etch the substrate and clean the chamber, the first process gas comprising a first fluorine-containing gas consisting essentially of a fluorine-containing gas compound comprising at least a first ratio of fluorine to other constituent species; and in a second stage, providing an energized second process gas in the chamber under process conditions selected to simultaneously etch the substrate and clean the chamber, the second process gas comprising a second fluorine-containing gas comprising a second fluorine-containing gas compound comprising a second ratio of fluorine to other constituent species that is less than the first ratio.

13. A method according to claim 12 wherein the first process gas comprises $SF_6$.

14. A method according to claim 12 comprising energizing the first process gas in the chamber with an inductive source power from about 600 to about 1200 watts and a bias power from about 70 to about 100 watts and comprising maintaining the chamber at a pressure from about 5 to about 70 mTorr.

15. A method according to claim 12 wherein the second process gas comprises $CF_4$.

16. A method according to claim 12 comprising energizing the second process gas in the chamber with an inductive source power from about 600 to about 1200 watts and a bias power from about 70 to about 100 watts and comprising maintaining the chamber at a pressure from about 5 to about 70 mTorr.

17. A method of forming a nitride mask layer on a substrate in a chamber, the method comprising:

placing the substrate in the chamber, the substrate comprising a nitride layer and an underlying silicon-containing layer;

in a first stage, providing an energized first process gas in the chamber to etch the nitride layer and to simultaneously remove etchant residue from the surfaces of the chamber the first process gas comprising a first fluorine-containing gas compound; and in a second stage, providing an energized second process gas in the chamber to etch the nitride layer and the underlying silicon-containing layer and to simultaneously remove etchant residue from the surfaces of the chamber the second process gas comprising a second fluorine-containing gas compound.

18. A method according to claim 17 wherein the second fluorine-containing gas compound has a ratio of fluorine to other constituent species that is less than a fluorine to other constituent species ratio of the first fluorine-containing gas compound.

19. A method according to claim 18 wherein the second fluorine-containing gas compound has a ratio of fluorine to other constituent species that is less than a fluorine to other constituent species ratio of the first fluorine-containing gas compound by at least about 1.5.

20. A method according to claim 17 wherein the first process gas comprises $SF_6$.

21. A method according to claim 17 wherein the second process gas comprises $CF_4$.

22. A method according to claim 17 wherein the first process gas comprises $SF_6$ and the second process gas comprises $CF_4$.

23. A method of etching a substrate in a chamber, the method comprising:

placing the substrate in the chamber;

in a first stage, providing an energized first process gas in the chamber to etch the substrate and to simultaneously remove etchant residue from the surfaces of the chamber, the first process gas comprising $SF_6$; and in a second stage, providing an energized second process gas in the chamber to etch the substrate and to simultaneously remove etchant residue from the surfaces of the chamber, the second process gas comprising $CF_4$.

24. A method of etching a substrate and cleaning surfaces of a chamber, the method comprising:

placing the substrate in the chamber;

in a first stage, providing an energized first process gas in the chamber to etch the substrate and to simultaneously remove etchant residue from the surfaces of the chamber, the first process gas comprising a first fluorine-containing gas compound comprising $SF_6$; and in a second stage, providing an energized second process gas in the chamber to etch the substrate and to simultaneously remove etchant residue from the surfaces of the chamber, the second process gas comprising a second fluorine-containing gas compound.

25. A method according to claim 24 wherein the second fluorine-containing gas compound has a ratio of fluorine to other constituent species that is less than a fluorine to other constituent species ratio of the first fluorine-containing gas compound.

26. A method according to claim 24 wherein the second process gas comprises $CF_4$.

27. A method of etching a substrate and cleaning surfaces of a chamber, the method comprising:

placing the substrate in the chamber;

in a first stage, providing energized first process gas in the chamber to etch the substrate and to simultaneously remove etchant residue from the surfacer of the chamber, the first process gas comprising a first fluorine-containing gas compound the first fluorine containing gas compound comprising a first ratio of fluorine to other constituent species and in a second stage, providing an energized second process gas in the chamber to continue etching the substrate, the second process gas comprising a second fluorine-containing gas compound the second fluorine containing gas compound comprising a second ratio of fluorine to other constituent species, wherein the second process gas is provided under conditions selected to simultaneously etch the layer and remove etchant residue from the surfaces of the chamber.

28. A method according to claim 27 wherein the second fluorine-containing gas compound has a ratio of fluorine to other constituent species that is less than the fluorine to other constituent species ratio of the first fluorine-containing gas compound.

29. A method according to claim 27 wherein the first process gas comprises $SF_6$.

* * * * *